United States Patent [19]

Levine

[11] Patent Number: 4,617,520
[45] Date of Patent: Oct. 14, 1986

[54] DIGITAL LOCK DETECTOR FOR A PHASE-LOCKED LOOP

[75] Inventor: Stephen N. Levine, Chicago, Ill.

[73] Assignee: Motorola, Inc., Schaumburg, Ill.

[21] Appl. No.: 567,714

[22] Filed: Jan. 3, 1984

[51] Int. Cl.[4] ............ H03D 13/00; H03K 9/06; H03L 7/00
[52] U.S. Cl. .................... 328/133; 328/155; 331/25; 331/DIG. 2; 377/851
[58] Field of Search .......... 328/133, 134, 155; 331/1 A, 25, DIG. 2; 377/112, 51

[56] References Cited

U.S. PATENT DOCUMENTS

| | | | |
|---|---|---|---|
| 3,684,965 | 8/1972 | Gautney et al. | 328/138 |
| 3,721,906 | 3/1973 | Geesen et al. | 328/109 |
| 3,962,645 | 6/1976 | Steward | 328/138 |
| 3,982,190 | 9/1976 | Schaefer | 328/110 |
| 3,988,696 | 10/1976 | Sharpe | 328/155 |
| 4,021,653 | 5/1977 | Sharp et al. | 320/138 |
| 4,122,405 | 10/1978 | Tietz et al. | 328/133 |
| 4,302,817 | 11/1981 | Labedz | 364/724 |
| 4,310,805 | 1/1982 | Hackert et al. | 331/DIG. 2 |
| 4,437,072 | 3/1984 | Asami | 331/1 A |

Primary Examiner—Stanley D. Miller
Assistant Examiner—Timothy P. Callahan
Attorney, Agent, or Firm—James E. Jacobson, Jr.; Edward M. Roney; Donald B. Southard

[57] ABSTRACT

A digital lock detector for a phase-locked loop accumulates out-of-lock pulses which are derived from a high frequency clock signal. The out-of-lock pulses are gated by an out-of-phase indicator signal and a pulse centered around the phase-locked loop output cycles to reduce the effect of relative phase jitter between the input and output signals of the phase-locked loop. The digital lock detector utilizes two counters in series which are reset independently to provide resistance to fading signal conditions. In addition, the lock detector circuit requires several consecutive long out-of-lock indications before an out-of-lock condition is indicated.

5 Claims, 6 Drawing Figures

DIGITAL LOCK DETECTOR FOR A PHASE-LOCKED LOOP

BACKGROUND OF THE INVENTION

This invention relates generally to the field of digital phase-locked loops and specifically to an improved lock detector for a phase-locked loop wherein an out-of-lock signal is used to gate high frequency clock pulses into a two stage counter circuit which accumulates the out-of-lock clock pulses. If the lock detector circuit indicates a locked state of the phase-locked loop, several consecutive out-of-lock cycles are required before the lock detector circuit will be set to indicate an out-of-lock condition.

DESCRIPTION OF THE PRIOR ART

The conventional digital phase-locked loop (DPLL) is coupled to a clock signal which provides a reference operating frequency and is typically divided to the exact operating frequency of the loop. In addition to a frequency divider, the conventional DPLL circuit comprises a phase comparator and a phase compensation network. In operation, the divided operating frequency is coupled to the phase comparator, which compares the phase of the divided operating frequency with the phase of a received data signal. The phase comparator instructs the phase compensation circuit to adjust the phase of the divided clock by advancing or delaying the phase of the divided clock signal. A digital phase-locked loop of this type is shown and described in U.S. Pat. No. 3,983,498 by Malek entitled, "Digital Phase-Locked Loop" and assigned to the assignee of the present invention.

Phase-locked loops can additionally be provided with a lock detector circuit to provide an indication that a known frequency has been detected. A typical lock detector compares the relative phase of the DPLL output signal and the received data signal. If the two signals are out-of-phase, an out-of-phase signal is used to gate a high speed counter, over a single time interval, and the total count is compared to a threshold number. If the count is greater than the threshold, out-of-lock is indicated. This type of lock detector provides a relatively accurate indication of lock in the phase-locked loop. However, this type of circuit may erroneously indicate an out-of-lock state due to errors which occur due to signal noise. In addition, this type of circuit is prone to "chattering" in conditions in which the signal is fading or instantaneously dropping-out.

SUMMARY OF THE INVENTION

Accordingly, it is an object of the present invention to provide a digital lock detector circuit for use in a phase-locked loop which can detect a locked condition based on a statistical indication of out-of-lock pulses.

It yet is another object of the present invention to provide a digital lock detector circuit for use in a phase-locked loop wherein several out-of-lock cycles are required to override a locked indicaion.

It is yet another object of the present invention to provide a digital lock detector for use in a phase-locked loop which utilizes a multilevel out-of-lock pulse accumulator to generate out-of-lock cycles.

Briefly described, the present invention contemplates a digital lock detector for use in a phase-locked loop. The present invention utilizes two counters coupled in series, with each counter being reset independently. The two counters accumulate gated out-of-lock clock pulses and provide two time intervals, a long time interval divided into a number of short intervals. The long interval and the short interval counters are provided with independent thresholds. The short interval provides an indication of relative phase lock, and can be adjusted to indicate a predetermined degree of phase offset between the input and output signals of the phase-locked loop, and additionally will tolerate some degree of signal-noise without indicating an out-of-lock state. The long interval counter accumulates the overflow pulses from the short period counter which indicates an out-of-locked state with some noise immunity. The present invention also provides a gated out-of-lock pulse which is centered within the output period of the phase-locked loop to reduce the effect of relative phase jitter between the phase-locked loop output signal and the received data signal. Once the phase-locked loop digital lock detector indicates a locked state, a predetermined number of consecutive long interval out-of-lock indications are required before the out-of-lock state is set.

BRIEF DESCRIPTION OF THE DRAWINGS

FIG. 3a is a timing diagram detailing the operation of the frequency adjustment portion of FIG. 2a.

FIG. 3b is a timing diagram detailing the operation of the phase adjustment portion of FIG. 2a.

DETAILED DESCRIPTION OF THE DRAWINGS

Figure 1:
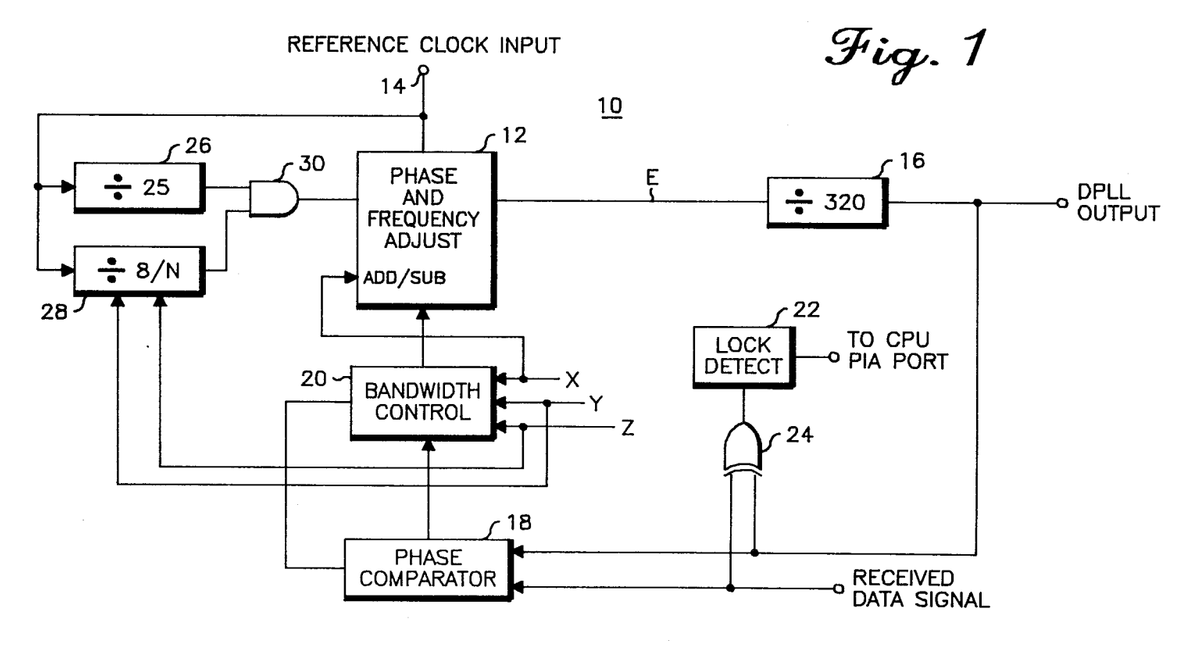
FIG. 1 is a block diagram of a multiple frequency digital phase-locked loop of a type which would utilize the lock detector circuit of the present invention.

FIG. 1 shows a block diagram of the multiple frequency digital phase-locked loop (DPLL) 10, which circuit has constructed in accordance with the present invention. The DPLL circuit comprises a phase and frequency adjust network 12 which is coupled to a digital divider 16, a bandwidth control 20, an AND gate 30 and an input clock terminal 14. The bandwidth control 20 is also coupled to a phase comparator 18. The phase comparator 18 accepts inputs from the output of the digital divider 16 as well as the received data signal.

In operation, a reference clock signal from a signal source is coupled to the phase and frequency adjust network 12 through terminal 14. The reference clock signal is additionally coupled to digital divider 26 and the programmable digital divider 28. The phase and frequency adjust network 12 generates a shifted clock signal from the reference clock signal, and generates frequency shifts by selectively adding or subtracting the reference clock signal and the shifted clock signal at a rate determined by the programmable clock from signal AND gate 30, which is controlled by programmable signals Y, and Z. The phase and frequency adjust network also effects frequency shifts as directed by a programmable control signal X, as well as the signals generated by the bandwidth control 20.

The phase and frequency adjust network 12 provides a composite clock signal E which is coupled to digital divider 16. The digital divider 16, frequency divides the composite clock signal E and provides the output signal of the digital phase-locked loop. The output of digital divider 16 is coupled to one input of the phase comparator 18. A second input of phase comparator 18 is coupled to a received data signal. The phase comparator provides a signal which is related to the relative phase of the output of the DPLL and the received data signal. If the DPLL output signal and the input data signal are not exactly in phase, an output is indicated. The operation of the phase comparator will be discussed in more detail later.

The multiple frequency digital phase-locked loop is additionally provided with two frequency dividers 26 and 28 which are coupled between the clock input 14 and an AND gate 30. The digital divider 28 accepts programmable inputs Y, Z which cause divider 28 to effect a variety of divide ratios. The programmable controls Y, Z, as well as a control X cooperate with a bandwidth control 20 and cause the bandwidth control to vary the loop correction bandwidth in accordance with loop operating frequencies. The programmable control X also cooperates with the phase and frequency adjust network 12 and controls the direction of frequency corrections by the digital phase-locked loop. The inputs to phase comparator are also coupled to an EXCLUSIVE-OR gate 24 which is further coupled to a lock detector 22.

As mentioned earlier, the multiple frequency DPLL cooperates with three programmable control inputs X, Y, Z. The programmable control signals cooperate with the bandwidth control 20, the phase and frequency adjust 12 and the programmable digital divider 28 and direct the center frequency and bandwidth of the multiple frequency DPLL. In the preferred practice of the present invention, it is desirable to provide a first operating frequency with a wide band capability and several other operating frequencies with a narrow band capability. This feature allows the testing a number of operating frequencies while having the multiple frequency DPLL programmed to a known single frequency. The bandwidth control 20 effects a loop bandwidth variation by altering the number of digital pulses which are added or subtracted from the composite clock, while effecting loop phase adjustments.

The programmable control signals Y, Z also control the loop operating frequency in the following manner. The composite reference clock signal is coupled, through the phase and frequency adjust network 12, to divider 16. In the preferred embodiment, a clock reference signal of 1.92 mHz is provided, and with no other manipulation, divider 16 would provide a loop operating frequency of 6000 Hz. Therefore, the multiple frequency DPLL is capable of making approximately 6000 corrections per second. In addition, dividers 26 and 28 are coupled to the 1.92 mHz reference clock and to AND gate 30 and provides an output signal which can be several possible frequencies, based on the programmable control signals Y, Z. The output frequency of AND gate 30 is equivalent to $$f_{Ederived} = \frac{N}{200} (f_{reference})$$

where N is provided by programmable controls Y, Z as shown in FIG. 1. Therefore, for example, for N=1, this output is $$\frac{1.92 \text{ mHz}}{200} = 9600 \text{ Hz}$$

the programmable clock signal is coupled to the phase and frequency adjust network 12 which either adds, subtracts, or possibly neither, shifted reference clock pulses from the 1.92 mHz reference clock signal at a rate determined by the programmable clock signal. Therefore for N=1 the loop operating frequency would calculated as follows:

$$\frac{1.92 \text{ mHz} + 9600 \text{ Hz}}{320} = 6030 \text{ Hz}$$

As mentioned earlier, for the frequencies described, the multifrequency DPLL can make approximately 6000 corrections/second. If the phase and frequency adjust network adds or subtracts 6000 pulses/second from the reference clock signal, the digital phase locked loop can compensate for phase disparities according to the following relationship:

$$\frac{1.92 \text{ mHz} + 6000 \text{ Hz}}{320} = 6018.75 \text{ Hz}$$

Therefore, if the bandwidth control 20 adds or subtracts 1 pulse per correction, the loop bandwidth can be defined as:

$$6000 \text{ Hz} \pm 18.75 \text{ Hz}$$

The phase comparator 18 can be programmed to make phase comparisons on the positive edges of fl or on both positive and negative edge of fo when X Y Z=0 0 0 respectively. The latter condition carries approximately 12000 corrections to be made per second and is used in conjunction with additional pulse per correction being added or subtracted to expand the DPLL lock bandwidth.

$$\frac{1.92 \text{ mHz} + 2(12000) \text{ Hz}}{320} = 6000 \pm 75 \text{ Hz}$$

The programmable control signals X, Y, Z instruct the bandwidth control 20 to add/subtract 1,2, or 4 pulses per correction, therefore, according to the preferred practice of the present invention, and the relationships above, the multifrequency DPLL can exhibit loop bandwidths of 18.75 Hz, 75 Hz or 150 Hz under the control of the bandwidth control circuit 20.

The relationship between the programmable control signals X, Y, Z and loop operating frequency and bandwidth is shown below in Table 1.

TABLE 1

| X | Y | Z | Center Frequency | Mode 1 Bw+/− | Mode 2 Bw+/− |
|---|---|---|---|---|---|
| 0 | 0 | 0 | 6000 | 75 Hz | 150 Hz |
| 0 | 0 | 1 | 5970 | 18.75 Hz | 18.75 Hz |
| 0 | 1 | 0 | 5940 | 18.75 Hz | 18.75 Hz |
| 0 | 1 | 1 | 5910 | 18.75 Hz | 18.75 Hz |
| 1 | 0 | 0 | 6000 | 18.75 Hz | 18.75 Hz |
| 1 | 0 | 1 | 6030 | 18.75 Hz | 18.75 Hz |
| 1 | 1 | 0 | 6060 | 18.75 Hz | 18.75 Hz |

TABLE 1-continued

| X | Y | Z | Center Frequency | Mode 1 Bw+/− | Mode 2 Bw+/− |
|---|---|---|---|---|---|
| 1 | 1 | 1 | 6090 | 18.75 Hz | 18.75 Hz |

Figure 2A:
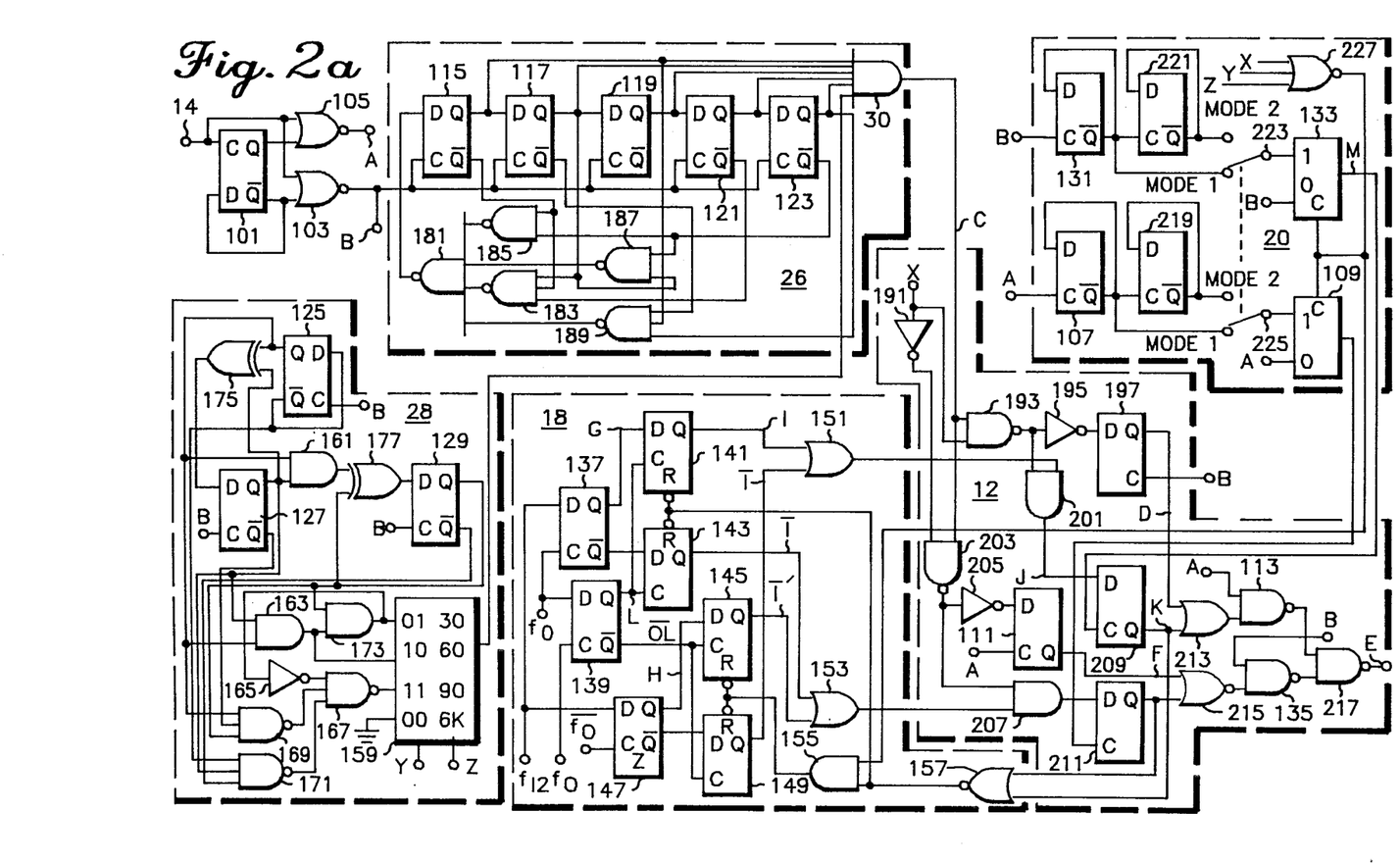
FIG. 2a is a schematic of the programmable divider, the phase comparator, and the phase frequency adjust network of FIG. 1.
Figure 3A:
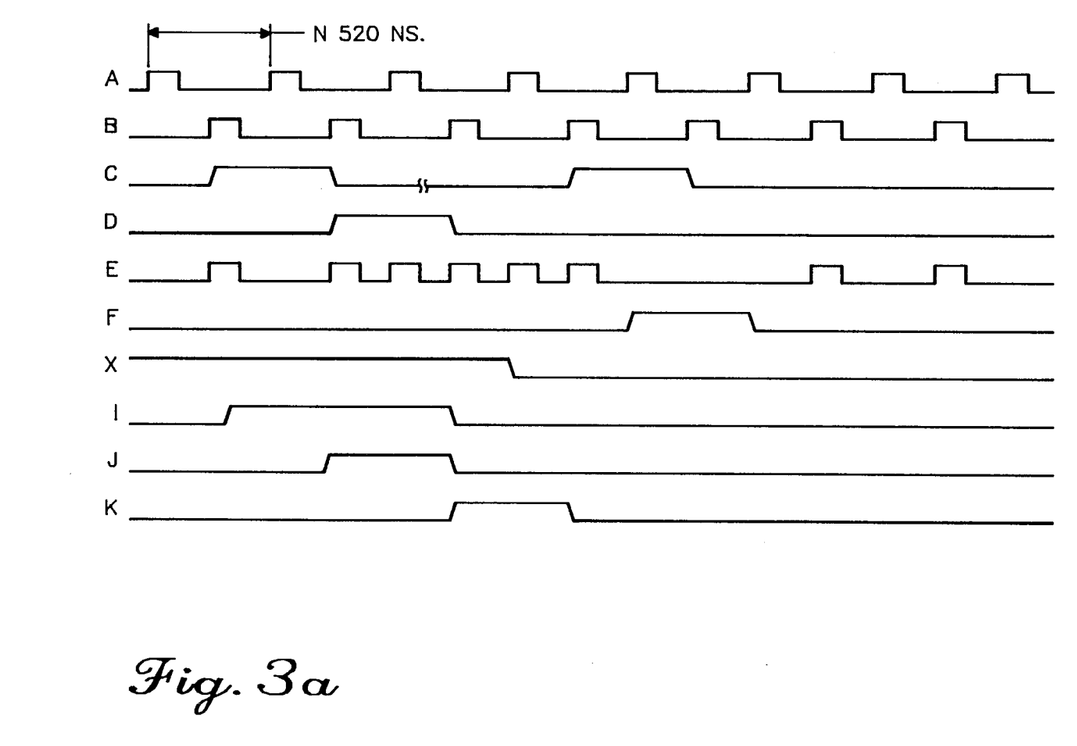

FIG. 2a shows an electrical schematic of the phase and frequency adjust network 12, the phase comparator 18, the bandwidth control 20, and the digital dividers 26, 28 of FIG. 1. The associated timing diagrams for FIG. 2a are shown in FIG. 3a and FIG. 3b. According to FIG. 2a, a reference clock signal is coupled to terminal 14 and provides the operating reference frequency for the multiple frequency DPLL. The reference clock signal is processed by flip-flop 101 which is further coupled to NOR gates 103, 105. The flip-flop 101 and NOR gates 103, 105 provide a reference clock, signal B, and a shifted reference clock signal, signal A, which are shown in FIG. 3a. The output terminal of NOR gate 105, or signal A, is coupled to a flip-flop 107 which forms an input to the bandwidth control 20. Signal A is also provided to a multiplexer 109 which is also associated with the bandwidth control 20. Signal A is additionally coupled to a flip-flop 111 and an AND gate 113 which form a portion of the phase and frequency adjust network 12.

The output of NOR gate 103, signal B, is coupled to flip-flops 115, 117, 119, 121, 123 which form a portion of frequency divider 26 of FIG. 1. In addition, signal B is coupled to flip-flops 125, 127 and 129 which form a portion of the programmable divider 28. Signal B is additionally coupled to flip-flop 131 and multiplexer 133 in the bandwidth control circuit 20. Signal B is further coupled to AND gate 135 in the phase and frequency adjust network 12.

Referring still to FIG. 2a, the phase comparator 18 comprises flip-flops 137, 139, 141, 143, 145, 147 and 149, OR gates 151 and 153, AND gate 155, and NOR gate 157 which are coupled as shown in FIG. 2a. Specifically, flip-flop 137 is coupled to flip-flops 141 and 143 which form a portion of the phase advance circuitry of the phase comparator 18. Likewise, flip-flop 147 is coupled to flip-flops 145 and 149 and form a portion of the phase retard circuitry of the phase comparator 18. Flip-Flop 139 is coupled to flip-flops 143 and 145 and provides signals to both the phase advance and phase retard portions of comparator 18. OR gate 151 is coupled to flip-flops 141 and 149 and provides a first output signal for the phase comparator 18. OR gate 153 is coupled to flip-flops 143 and 145 and provides a second output signal for the phase comparator circuit. AND gate 155 is coupled to flip-flops 145 and 149 and cooperates with NOR gate 157 which is coupled to flip-flops 141 and 143 to provide a reset function to the phase comparator 18. It should be noted that flip-flops 137, 139, 141, 143, 145, 147 and 149 are D-type flip-flops which are well known.

Figure 3B:
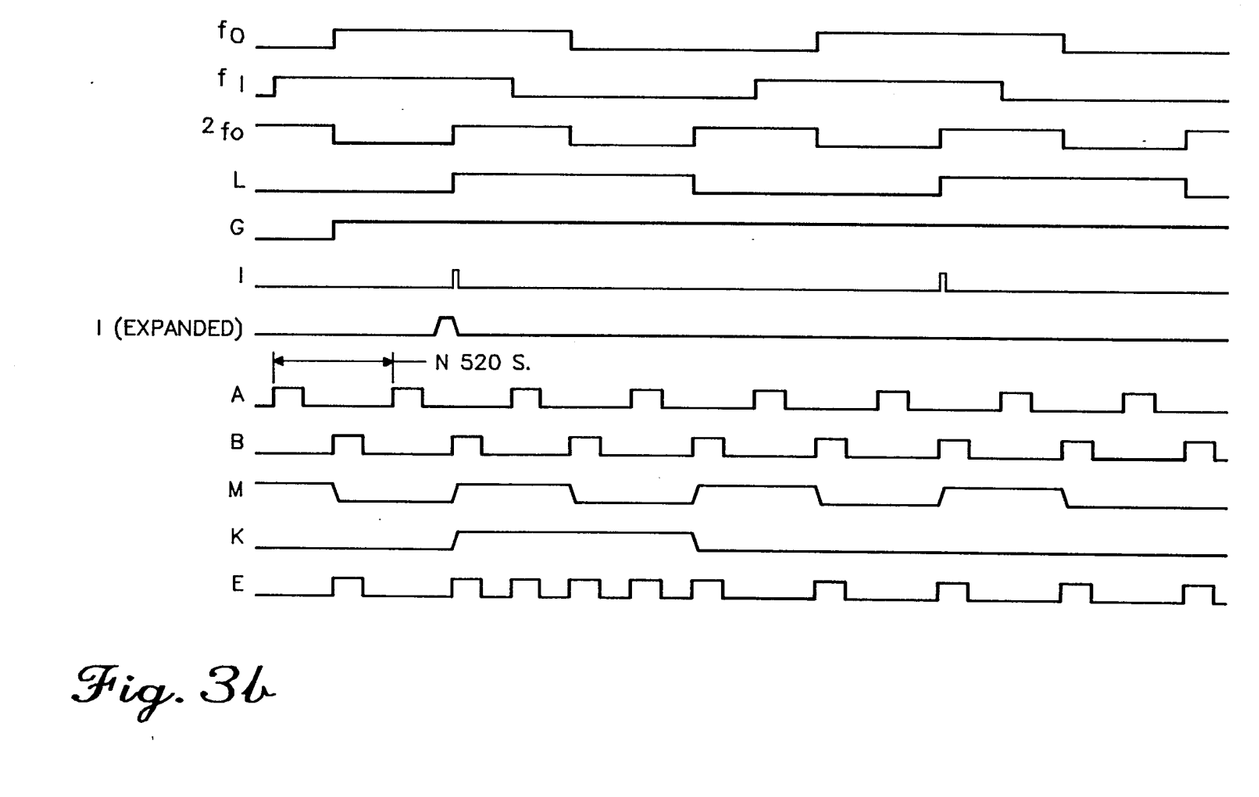

The operation of the phase comparator 18 will be explained in conjunction with FIG. 3b. Referring now to FIG. 3b, there is shown two timing signals $f_o$, and $2f_o$. These signals are derived from the clock reference signal by the digital divider circuit 16 of FIG. 1, which will be discussed more fully below. The three derived timing signals $f_o$, $\overline{fHD}$ o and $2f_o$ of FIG. 3a are coupled to the phase comparator 18 of FIG. 2a as shown. Specifically, timing signal $f_o$ is provided to the D terminal of flip-flop 139 and the C terminal of flip-flop 137. The $\overline{fHD}$ o timing signal is provided to the C terminal of flip-flop 147. The $2f_o$ timing signal is provided to the C terminal of flip-flop 139. The incoming data signal, $f_o$, is coupled to the D input terminals of flip-flops 137 and 147.

Referring now to FIGS. 2a and 3b, signal G of FIG. 3b corresponds to the Q output signal of flip-flop 137 of FIG. 2a. Signal H of FIG. 3b corresponds to the Q output terminal of flip-flop 147 of FIG. 2a. Signal I of FIG. 3b corresponds to the Q output terminal of flip-flop 141 of FIG. 2a. Signal G of FIG. 3b corresponds to the Q output terminal of flip-flop 137 of FIG. 2a.

As mentioned earlier, the purpose of phase comparator 18 is to provide output signals which indicate the relative phase of the reference clock signal and the received data signal. The phase locked loop output signal $f_o$ is used to sample the received data signal $f_i$. Three possible phase relationships may exist between these two signals. The signals may be in phase, or the phase locked loop output signal may be leading or lagging the incoming data signal. Flip-flops 137 and 139 provide a comparison of the incoming data signal and the DPLL output signal. If the incoming data signal ($f_i$) leads the divider 16 output signal as shown in FIG. 3b, flip-flop 137 will cause signal G to be set high. Since flip-flop 137 is clocked directly by $f_o$, signal G will be set high on the leading edge of a transition in $f_o$. Flip-flop 139 is coupled to $f_o$ and is clocked by a $2f_o$ signal, therefore, for every positive transition in $f_o$, signal L will be set high, however, $2f_o$ will be set high ½ cycle after $f_o$ was set high because of the ½ cycle delay generated by flip-flop 139. Actual phase corrections are effected on a positive transition in signal L, therefore, it is desirable to delay signal L to prevent phase corrections from occurring on an edge of the $f_o$ control clock.

For the phase condition shown in FIG. 3b and described above, a positive transition in signal G followed by a positive transition in L will cause the output of flip-flop 141 to be set high (signal I). A high value in signal I indicates that $f_i$ is leading $f_o$ and therefore pulses should be added to the composite system clock to cause the phase of $f_o$ to advance. If the phase of the DPLL output signal leads the received data signal, the output of flip-flop 143, signal $\overline{I}$ will be set high indicating pulses should be subtracted from the composite system clock to cause $f_o$ to retard.

Flip-flops 145, 147 and 149 operate in an analogous fashion, however flip-flop 147 is clocked on the negative edge of $f_o$ and generate phase comparison signals I' and $\overline{I}'$ which are delayed with respect to signals I and $\overline{I}$. Flip-flops 145, 147 and 149 are held in reset by the bandwidth control circuit 20 through AND gate 155. If the digital phase-locked loop circuit is set for narrow band operation, one phase comparison per period of $f_o$ is required. If the digital phase-locked loop is set for wide band operation, flip-flops 145, 147 and 149 are activated and the phase comparator 18 provides two phase comparisons per comparison period. That is one comparison on the leading edge of $f_o$ and one on the trailing edge of $f_o$. Flip-flop 141, 143, 145 and 149 are also reset whenever a phase adjustment has been made, through AND gate 155 and NOR gate 157.

Referring now to FIG. 2a, the DPLL digital divider 28 is shown. Digital divider 28 is clocked by system clock B and provides a variable divide ratio based on programmable system controls Y, Z. Digital divider 28 comprises flip-flops 125, 127 and 129 as well as multiplexer 159 and AND gates 161, 163 and 173, NAND gates 167, 169 and 171, inverter 165, and EXCLUSIVE-OR gates 177 and 175, coupled as shown in FIG. 2a.

Digital divider 26 comprises flip/flops 115, 117, 119, 121, 123 and NAND gates 181, 183, 185, 187 and 189 coupled as shown in FIG. 2a.

Divider 26 provides a fixed divide ratio of 25. Divider 28 provides a variable divide ratio from 1 to 8. The outputs of dividers 26, 28 are combined by AND gate 30 in a dual-modulus fashion to provide a composite divide ratio of 200/N wherein N is controlled by programmable controls Z, Y. It should be noted that digital dividers of this type are well known and several divider configurations would function satisfactorily. Therefore dividers 26, 28 may be any suitable conventional 200/N digital divider and is not limited to the specific configuration shown in FIG. 2a.

Referring still to FIG. 2a, there is shown the phase and frequency adjust network 12 of FIG. 1. The phase and frequency adjust network 12 cooperates with programmable control signal X, the derived programmable clock signal, the reference clock signal B, the shifted reference clock signal A, and the bandwidth control 20 output signal, and adds or subtracts pulses to the DPLL reference signal B to compensate for phase disparities or frequency changes. The phase and frequency adjust network 12 comprises flip-flops 111 and 197 which effect frequency adjustments and flip-flops 209 and 211 which effect phase adjustments. The phase and frequency network additionally includes inverters 191, 195, 205, NAND gates 193, 203, 113, 135, and 217, AND gates 201 and 207, NOR gates 215 and 157 and OR gate 213 coupled as shown in FIG. 2a.

As mentioned earlier, OR gates 151 and 153 in the phase comparator 18 provide an output signal wherein an active signal appearing at the output of OR gate 151 indicates pulses should be added to the composite clock, signal E, to compensate for phase and an active output appearing at the output of OR gate 153 similarly indicates pulses should be subtracted to compensate for phase. The phase and frequency adjust network 12 also cooperates with programmable signals X, Y, Z, to effect frequency shifts in the operating frequency of the digital phase-locked loop.

Figure 2B:
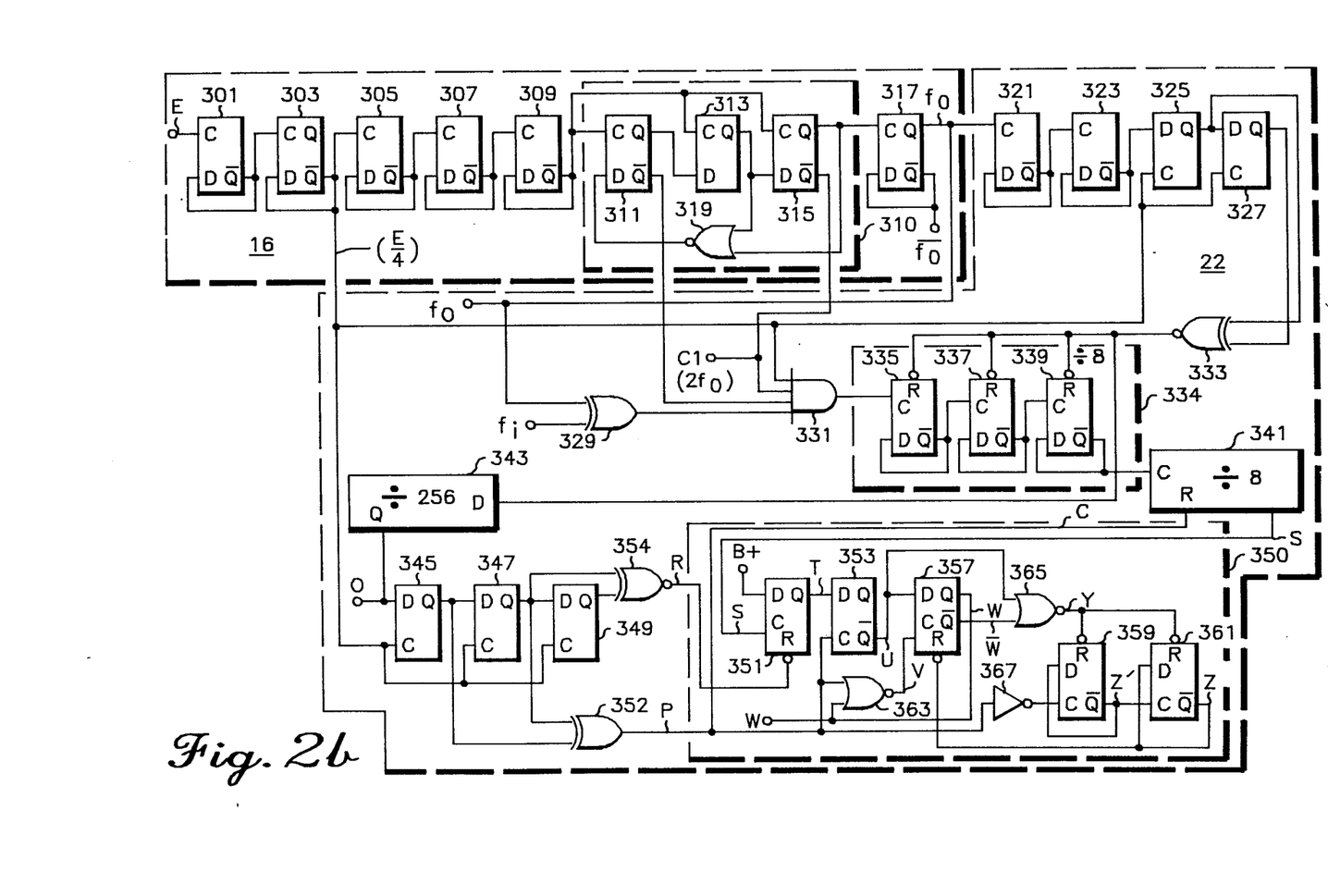
FIG. 2b is a schematic of the digital phase-locked loop frequency divider of FIG. 1 and the preferred embodiment of the lock detector circuit of the present invention.

The phase and frequency adjust network 12 provides phase and frequency adjustments by combining or subtracting a reference clock, signal B, and a shifted reference clock, signal A, to provide a composite clock signal E which operates the digital phase-locked loop divider 16 of FIG. 2b. In addition, the phase and frequency adjust network 12 is coupled to the output of AND gate 30 which produces a programmable clock signal and establishes the adjustment rate of the phase and frequency adjust network 12.

The phase and frequency adjust network 12 further cooperates with programmable input signal X which indicates positive or negative frequency shifts from the center loop operating frequency.

In operation, the phase and frequency adjust network 12 is continuously provided with clock signal A through flip-flop 111 and NAND gate 113, clock signal B through flip-flop 197 and NAND gate 135, and clock signal C through NAND gates 193 and 203. Programmable input signal X is coupled to inverter 191 which selectively activates either flip-flop 197 (frequency add) or flip-flop 111 (frequency subtract), depending on the state of signal X. If programmable control signal X is low, then the derived programmable clock signal C will be coupled to flip-flop 197 through NAND gate 193 and inverter 195. In a similar fashion, if programmable input signal X is high, then the derived clock signal C is coupled to flip-flop 111 through NAND gate 203 and inverter 205. If the programmable derived clock signal C appears at the delay input of flip-flop 197, clock signal B will allow signal C to clock through flip-flop 197 to OR gate 213. The next B clock pulse will reset flip-flop 197, thus gating a single pulse through flip-flop 197.

The output of OR gate 213 is normally low, except when pulses are to be added to the main system clock B, therefore, when the output of flip-flop 197 is high, clock A will be summed with clock signal B through NAND gates 113, 135 and 217.

Pulses are subtracted from the clock B in a similar fashion. If programmable input signal X is low, the programmable derived clock signal C will be coupled to flip-flop 111 through NAND gate 203 and inverter 205. Programmable derived clock signal C is clocked through flip-flop 111 with each positive transition of clock signal A, allowing the output to go high, thus forcing the output of NOR gate 215 low. When the output of NOR gate 215 goes low, NAND gate 135 will be disabled and the main system clock B will be isolated from the composite clock signal E.

Phase compensations are also effected utilizing OR gate 213, NOR gate 215 and NAND gates 113, 135 and 217. As mentioned earlier, the output of OR gates 151 and 153 comprise phase adjust indication signals. That is, if the output of OR gate 151 is active, a positive phase adjustment is required. If the output of OR gate 153 is active, a negative phase shift is required. Referring now to FIG. 2a, the phase comparator 18 cooperates with the phase and frequency adjust network 12 through AND gates 201 and 207. AND gates 201 and 207 also cooperate with NAND gates 193 and 203 and provide arbitration between phase and frequency adjustments If a frequency adjustment is presently in process, AND gates 201 and 207 will prevent the phase adjustment from being effected until the frequency adjustment has been completed. This feature will be discussed in more detail later.

Assuming that a frequency adjustment is not currently in process, the phase comparison signals I, $\bar{I}$ I' or $\overline{I40}$, will be coupled to the delay inputs of flip-flops 209, 211 respectively. The phase adjust flip flop 209 and 211 also cooperate with clock signals A, B through the bandwidth control 20. The bandwidth control 20 will be discussed in more detail below. Briefly, however, the bandwidth control circuit 20 provides a control for the number of pulses to be added or subtracted to the composite clock signal E for phase comparisons.

The bandwidth control circuit effects variable pulse control by providing a variable clock signal to flip-flop 209 and 211. If the delay input of flip-flop 209 is active, every positive transition of the signal appearing at the clock terminal will cause signal K to go high, activating the output of OR gate 213 which enables NAND gate 113. As mentioned above if NAND gate 113 is enabled, pulses will be added to composite system clock E, wherein the actual number of phase pulses added is controlled by the clock terminal of flip-flop 209.

If a negative phase shift is required, pulses must be subtracted from the composite clock signal E. If the output of OR gate 153 is active, a negative phase adjustment is currently being effected, the output of NAND gate 203 is high, enabling AND gate 207, which couples the output of NOR gate 153 to flip-flop 211. Flip-flop 211 cooperates with the bandwidth control 20 through the clock terminal of flip-flop 211. With every positive transition of the bandwidth control clock generated in the bandwidth control circuit, the output of flip-flop 211 will go high if a negative phase shift is required. If the output of flip-flop 211 is high, the output of NOR gate 215 will go low disabling NAND gate 135, thus preventing the main clock signal B pulses from being combined with the composite system clock signal E.

As mentioned earlier, phase adjustments will be delayed if a frequency adjustment is currently being effected. Referring now to the phase comparator 18 of FIG. 2a, the outputs of flip-flops 141, 143, 145 and 149 comprise signals indicating phase adjustments. Once a phase adjustment signal appears, the signal will be maintained until the appropriate flip-flop is reset. The reset signal indicates that a phase adjustment has been completed. The phase adjust reset signal is derived from the phase and frequency adjust network 12 by NOR 157. The outputs of phase adjust flip-flops 209 and 211 are coupled to the inputs of NOR gate 157 such that whenever a phase adjustment has been completed, on the next subsequent bandwidth control clock, the output of NOR gate 157 will go low, resetting flip-flops 141 and 143.

Referring still to FIG. 2a, the bandwidth control 20 of FIG. 1 is shown in detail. The bandwidth control 20 is controlled by programmable control signals X, Y, and Z and programmable switches 223 and 225. The bandwidth control 20 provides a variable control determining the number of pulses to be added or subtracted during phase adjustments. Specifically the bandwidth control 20 can effect phase adjustments of one, two or four pulses based on programmable input signals. As mentioned earlier, the bandwidth control 20 provides a variable clock signal to flip-flops 209 and 211 of the phase and frequency adjust network 12.

The bandwidth control 20 comprises flip-flops 131 and 221 coupled as a frequency divider, flip-flops 107 and 219 also coupled as a frequency divider, NOR gate 227 programmable switches 223 and 225 and multiplexers 133 and 109. In operation, flip-flops 131 and 221 are coupled to clock B and provide signals at one-half and one-fourth the rate of reference clock signal B. Flip-flops 107 and 219 are coupled to clock signal A and provide signals at one-half and one-fourth the rate of clock signal A. The divided B and A clock signals are coupled to multiplexer 133 and 109 through programmable switches 223 and 225 respectively. The programmable switches 223 and 225 control which divided clock signal is coupled to multiplexer 133 and 109. If the mode one position is selected, a higher rate divided clock signal will be coupled to the phase adjust flip-flops 209 and 211, causing the Q outputs of flip-flops 209 and 211 to be set and cleared more quickly thereby reducing the number of pulses to be added or subtracted from the composite system clock, signal E.

If a relatively larger number of pulses are added or subtracted from the composite system clock, larger phase shifts will be effected, thus a wider bandwidth capability is provided to the loop. NOR gate 227 is coupled to the programmable loop control signals X, Y, Z and has an output coupled to the clock terminals of multiplexers 133 and 109.

A high output signal at the output of NOR gate 227 indicates that the digital phase locked loop has been set for wide band operation. This output signal causes multiplexers 133 and 109 to select the programmable switches 223 and 225 which have been previously set for a required system configuration, causing flip-flops 209 and 211 to effect multiple pulse corrections. If the output of NOR gate 227 is low, the multiple frequency digital phase-locked loop will be set for narrow band operation and multiplexers 109, 133 will select signals A and B causing single pulse corrections.

Figure 3C:
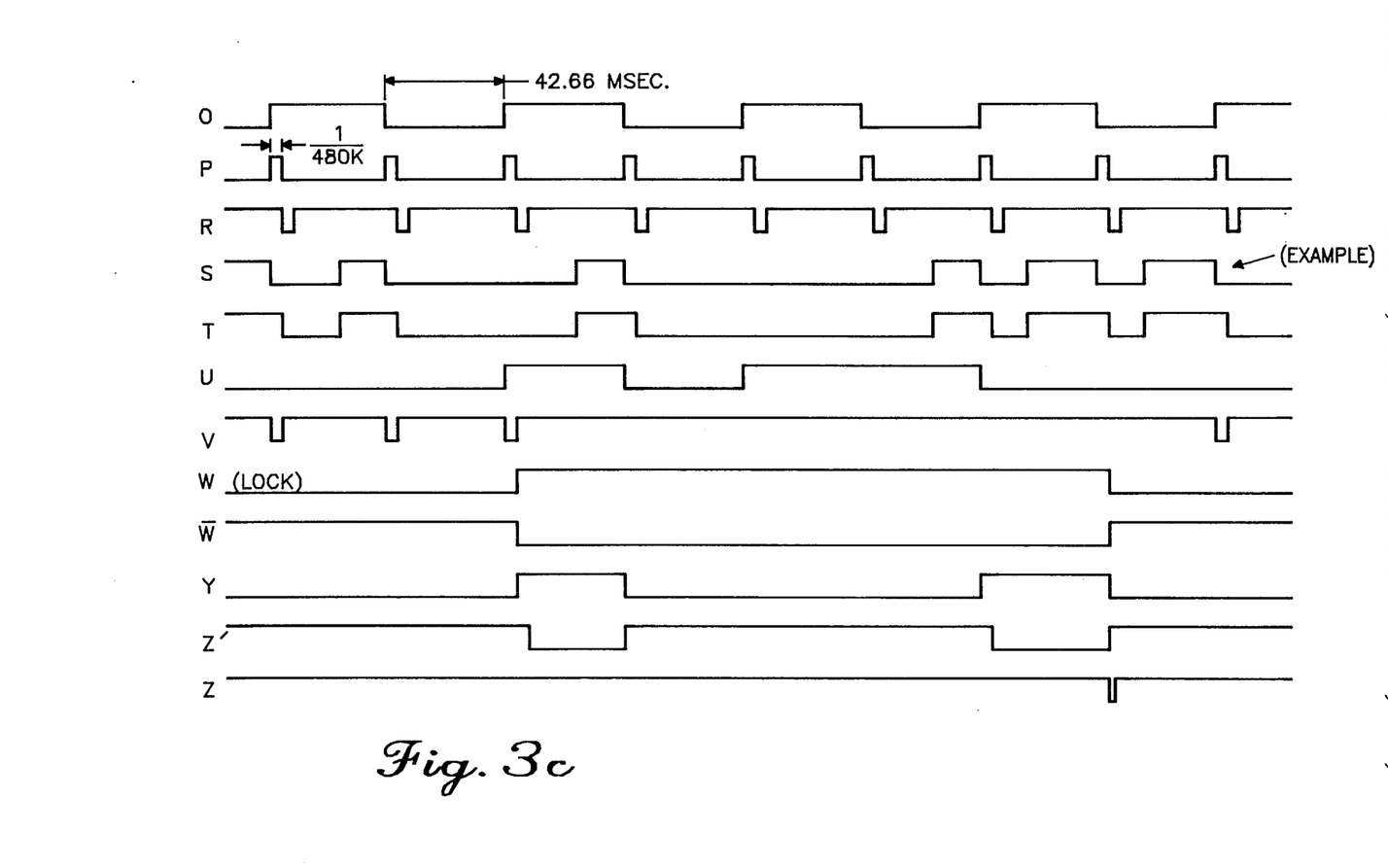
FIG. 3c is a timing diagram detailing the operation of the lock detect circuit of FIG. 2b.

Referring now to FIG. 2c, there is shown a detailed electrical schematic of the digital divider 16 and the lock detector 22 of FIG. 1. The various timing signals of FIG. 2b are shown in FIG. 3b and FIGS. 2a and 3c and will be referred to interchangeably.

The frequency divider 16 of FIG. 1 is coupled to the composite clock signal E of FIGS. 2a and 3a. The frequency divider 16 divides the composite clock signal E to provide the operating clock signal $f_o$, of the digital phase locked loop 10. In addition, the frequency divider 16 provides a plurality of derived clock signals to operate the lock detector 22. The frequency divider 16 comprises flip-flops 301, 303, 305, 307, 309, 311, 313, 315, 317 and NOR gate 319 coupled as shown in FIG. 2b which is a well-known frequency divider configuration. The output of flip-flop 303 provides a signal at one-fourth the frequency of composite clock signal E which is used to operate several portions of the lock-detector 22. In addition, flip-flops 311, 313 and 315, and NOR gate 319 form a divide-by-5 divider 310 which generates a signal of intermediate frequency with respect to the whole of divider 16. The combined outputs of divider 310 comprise a clock pulse centered around $f_o$, the operating clock signal of the digital phase-locked loop 10. According to the preferred practice of the present invention, divider 16 provides an output signal which has been divided by 320 with respect to the composite clock signal E. It should be noted that many frequency divider configurations would function satisfactorily with the present invention, and the present invention is not limited to the specific configuration shown in FIG. 2b.

Referring still to FIG. 2b, the lock detect circuit 122 of the present invention is shown in detail. The lock detector 122 compares the output clock signal of the digital phase-locked loop, $f_o$, and a received data signal, $f_i$, and provides an indication when the two signals are in phase. The lock detector circuit 22 allows the digital phase-locked loop of the present invention to be used as a tone detector. Since the digital phase-locked loop can be programmed to operate at a specifically known frequency, the preferred embodiment of the lock detector 22 can provide an indication that a specific frequency, within the operating bandwidth, has been detected.

The lock detect circuit inputs are provided by EXCLUSIVE-OR gate 329 which is coupled to the incoming data signal, $f_i$, and the frequency divider 16 output signal $f_o$. The output of EXCLUSIVE-OR 329 is high whenever $f_o$ and $f_i$ are out of phase. The output of EXCLUSIVE-OR 329 is coupled to a multiple input AND gate 331. AND gate 331 is further coupled to the output of flip-flop 303, which is the composite clock signal E divided by 4, (E/4), as well as the outputs of divider 310. The outputs of divider 310 provide a pulse centered around $f_o$ and are used to ensure that the results of the $f_i$ and $f_o$ comparison are gated-thru AND gate 331 free of $f_o$ jitter. When $f_o$ and $f_i$ are out of phase, the output of EXCLUSIVE-OR 329 will be high and AND gate will allow the (E/4) signal to clock flip-flop 335. If EXCLUSIVE-OR 329 output is low, AND gate 331 will be disabled and no E/4 clock pulses will reach flip-flop 335.

Flip-flops 335, 337, and 339 are coupled in a conventional divider configuration 334 and provide an overflow output pulse every time eight E/4 gated clock pulses are accumulated. Flip-flops 321, and 323 are coupled in a well-known divider configuration. Flip-flops 321 and 323 are coupled to the digital phase-locked loop output signal, $f_o$, and provide an output signal at one-fourth the frequency of $f_o$. Flip-flops 325 and 327 and EXCLUSIVE-NOR gate 333 comprise an edge detector circuit which is clocked by the relatively higher frequency clock E/4. Therefore the output of EXCLUSIVE-NOR 333 comprises a signal having a pulse occurring every fourth edge of the divided phase-locked loop output signal. In other words, the output signal of EXCLUSIVE-NOR 333 comprises a signal having a pulse occurring at a rate of $f_o/2$. The output signal of EXCLUSIVE-NOR 333 is used to reset divider 334. If less than 8 (E/4) gated clock pulses have been accumulated during two cycles of the digital phase-locked loop output signal, $f_o$, divider 334 will be reset and no overflow pulses will be generated. In the preferred practice of the present invention, frequency divider 334 can overflow from 0 to 4 times during two $f_o$ cycles.

The overflow pulses of divider 334 are used to clock divider 341. Divider 341 provides an output pulse whenever divider 334 produces 8 overflow pulses. If signals $f_o$ and $f_i$ are sufficiently out of phase, a significant number of gated (E/4) clock pulses will be accumulated by dividers 334 and 341. The overflow pulses of divider 341 are used to clock and latch flip-flop 351 which forms the input to the lock detect latching circuit 350. The lock detect latching circuit 350 accumulates divider 341 overflow pulses, S, and indicates whether the digital phase-locked loop is in a locked state. The lock detect latching circuit 350 is controlled by signals P and R, which comprise the output signals of EXCLUSIVE-OR gates 352 and 354 respectively.

Signals P and R are generated by divider 343 and a dual edge detector formed by flip-flop 345, 347 and 349 and EXCLUSIVE-NOR gate 354 and EXCLUSIVE-OR gate 352. Frequency divider 343 is coupled to the output of EXCLUSIVE-NOR 333 which is a pulsed signal having a frequency of $f_o/2$. Divider 343 provides an output pulse every 512 fo pulses. The output signal of divider 343, designated signal O, has a frequency of approximately 11.7 Hz in the preferred practice of the present invention. Flip-flops 345, 347, and 349 are coupled in a shift register configuration which is clocked by the (E/4) clock signal. EXCLUSIVE-OR 352 generates a pulse which occurs at each edge of the signal O pulses. EXCLUSIVE-NOR 354 generates a pulsed output signal R, which is identical in frequency but delayed with respect to signal P. As mentioned earlier, the various timing signals of the lock detect circuit 22 are shown in FIG. 3c and are referred to interchangeably with the designations shown in FIG. 2b.

Referring now to the lock detect latching circuit 350 of FIG. 2b, flip-flop 351 provides the first stage of the lock detect latching circuit. If a pulse occurs in signals, flip-flop 351 will be latched and signal T will be set high. Signal T will remain high until flip-flop 351 is reset by signal R. If no signal S overflow pulses have latched flip-flop 351, signal T will remain low. Flip-flop 351 is reset with delayed signal R, therefore if no overflow pulses are received, signal T will remain inactive. If signal T is inactive, the following C clock pulse will clock flip-flop 353 and cause signal U to go high. The high signal U pulse will be clocked into flip-flop 357 by the C clock causing signal W to go high. A logical high state in signal W indicates that the digital phase locked loop is in a locked state.

Once signal W has been set high, signal V will be forced low. Signal V clocks flip-flop 357, therefore, if signal V is latched low, flip-flop 357 will be disabled. Whenever signal W is latched high, signal $\overline{W}$ is necessarily latched low. When the lock detect signal W is active, and the last signal S segment, Signal U, indicated a no lock state, flip-flops 359 and 361 will not be reset. Flip-flops 359 and 361 will count C clock pulses as long as they are not reset. The output signal of flip-flop 361 is used to reset flip-flop 357 and causes signal W to indicate an out-of-lock condition. Therefore, for the in-lock indicator signal W, to be reset, two consecutive signal S out-of-lock indications must occur. Additional divider stages may be combined with flip-flops 359 and 361 to provide capability to require additional out-of-lock indicator pulses required for an out-of-lock indication.

In summary, a digital lock detector for a phase-locked loop has been described. The digital lock detector generates gated out-of-lock pulses from a high speed clock signal. The gated out-of-lock pulses are accumulated by a short period counter and a long period counter which are provided with independent thresholds. The two counter arrangement provides noise immunity as well as resistance to a fading input signal. The digital lock detector of the present invention also provides a gated out-of-lock pulse which is centered within the phase-locked loop output period to reduce the effect of relative phase jitter between the phase-locked loop output signal and the received data signal. The present invention also contemplates a lock detector which requires several out-of-lock long time intervals before the unlock state is indicated. Accordingly, other modifications, uses, and embodiments will be apparent to one skilled in the art without departing from the spirit and scope of the principles of the present invention.

What is claimed:

1. A lock detector for use in a phase-locked loop having an input signal and an output signal having a plurality of half cycles, for producing a lock detector output signal in response to the relative phase of said phase locked-loop input and output signals, comprising:
    input means for inputting said phase-locked loop input and output signals;
    comparing means coupled to said input means for generating an out-of-phase signal upon said phase-locked loop input and output signals being out-of-phase;
    clock means for generating high frequency clock pulses;
    gating means coupled to said clock means and said comparing means for gating said high frequency clock pulses to generate clock pulses whenever said out-of-phase signal indicates said phase-locked loop input and output signals are out-of-phase;
    first divider means coupled to said gating means for accmulating said gated clock pulses, wherein said first divider accumulates gated clock pulses over a relatively short period;
    second divider means coupled to said first divider means wherein said second divider accumulates overflow pulses output from said first divider wherein said overflow pulses output from said first divider comprise long period out-of-lock pulses which indicate that said phase-locked loop is out of lock, and are accumulated by said second divider over a relatively long period and each of said first and second divider means being reset periodically, but at different rates respectively; and lock indicator means coupled to said second divider means for indicating a locked condition in the event said second divider has not accumulated a predetermined number of long period out-of-lock pulses wherein said lock indicator means requires several consecutive long period out-of-lock cycles before using set to indicate an out-of-lock condition.

2. The lock detectorof claim 1 wherein said high frequency clock pulses are centered around the middle of each half cycle of said phase-locked loop output signal.

3. The lock detector of claim 1 wherein a programmable number of consecutive long period out-of-lock pulses are required to set the lock indicator to indicate an out-of-lock condition.

4. A method for detecting a locked condition in a phase-locked loop having input and output signals, said method comprising the steps of:

(a) generating an out-of-phase signal upon said phase-locked loop input and output signals being out of phase;

(b) generating a clock signal in the form of high frequency clock pulses and for gating same upon the presence of said generated out-of-phase signal;

(c) accumulating said gated high frequency, clock pulses with a first counter wherein said first counter accumulates pulses over a relatively short period;

(d) accumulating said first counter output pulses with a second counter wherein said second counter accumulates pulses over a relatively long period;

(e) resetting said first and second counters at periodic but different rates respectively; and (f) indicating a locked condition in the event that said second counter has not accumulated a predetermined number of pulses, before said second counter is reset.

5. The method of claim 4 further including the steps of:

(g) indicating an out-of-locked condition in the event that said second counter produces an output pulse over a plurality of consecutive relatively long period cycles.

* * * * *